(12) United States Patent
Zhang et al.

(10) Patent No.: US 9,515,095 B2
(45) Date of Patent: Dec. 6, 2016

(54) ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Feng Zhang, Beijing (CN); Qi Yao, Beijing (CN); Zhiyong Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 14/422,843

(22) PCT Filed: Jun. 30, 2014

(86) PCT No.: PCT/CN2014/081118
§ 371 (c)(1),
(2) Date: Feb. 20, 2015

(87) PCT Pub. No.: WO2015/035818
PCT Pub. Date: Mar. 19, 2015

(65) Prior Publication Data
US 2016/0043102 A1    Feb. 11, 2016

(30) Foreign Application Priority Data

Sep. 16, 2013    (CN) .......................... 2013 1 0422039

(51) Int. Cl.
*H01L 27/12* (2006.01)
*H01L 21/77* (2006.01)
(Continued)

(52) U.S. Cl.
CPC ......... *H01L 27/124* (2013.01); *G02F 1/13439* (2013.01); *G02F 1/134336* (2013.01);
(Continued)

(58) Field of Classification Search
None
See application file for complete search history.

(56) References Cited

U.S. PATENT DOCUMENTS

2006/0146256 A1* 7/2006 Ahn .................. G02F 1/134309
349/141
2007/0105286 A1* 5/2007 Huh ...................... H01L 27/124
438/152
(Continued)

FOREIGN PATENT DOCUMENTS

CN    101063781 A    10/2007
CN    101561604 A    10/2009
(Continued)

OTHER PUBLICATIONS

J. H. Lee, S. H. Lee, C. K. Hwangbo and K. S. Lee, J. Korean Phys. Soc., vol. 44, pp. 750-756, Mar. 3, 2004.*
(Continued)

*Primary Examiner* — Ha Tran T Nguyen
*Assistant Examiner* — Aaron Dehne
(74) *Attorney, Agent, or Firm* — Nath, Goldberg & Meyer; Joshua B. Goldberg; Christopher Thomas

(57) ABSTRACT

The invention belongs to the field of display technology, and particularly provides an array substrate and a method for manufacturing the same, and a display device. The array substrate includes a base substrate, and a thin film transistor and at least one driving electrode provided on the base substrate, and the thin film transistor includes a gate, and a source and a drain provided in the same layer, wherein the gate, the source or the drain is formed with the same material as the at least one driving electrode, and thickness thereof is larger than that of the at least one driving electrode. Regarding the array substrate, the manufacturing procedure of the array substrate is effectively simplified, cost for mask plate and material is reduced, equipment investment is reduced, (Continued)

production cost is saved, productivity is improved, and competitiveness of the display device is increased, while the transmittance requirement is met.

11 Claims, 8 Drawing Sheets

(51) Int. Cl.
    *G02F 1/1343*     (2006.01)
    *H01L 29/45*     (2006.01)

(52) U.S. Cl.
    CPC .............. *H01L 21/77* (2013.01); *H01L 27/12* (2013.01); *H01L 27/1259* (2013.01); *H01L 29/458* (2013.01); *G02F 2001/134372* (2013.01)

(56) References Cited

U.S. PATENT DOCUMENTS

2011/0019144 A1* 1/2011 Koh .................. G02F 1/134363
    349/143

2013/0155358 A1* 6/2013 Kim .................. G02F 1/134363
    349/110

FOREIGN PATENT DOCUMENTS

| | | |
|---|---|---|
| CN | 101894845 A | 11/2010 |
| CN | 103208491 A | 7/2013 |
| CN | 103268878 A | 8/2013 |
| CN | 103474434 A | 12/2013 |
| CN | 103779357 A | 5/2014 |
| KR | 20130020288 A | 2/2013 |

OTHER PUBLICATIONS

Form PCT/ISA/237 issued in International Application No. PCT/CN2014/081118 mailed Sep. 28, 2014.

1st Office Action issued in Chinese Application No. 201310422039.8 issued Jun. 2, 2015.

2nd Office Action issued in Chinese Application No. 201310422039.8 issued Aug. 21, 2015.

International Search Report dated Jun. 30, 2014 corresponding to application No. PCT/CN2014/081118.

* cited by examiner

ARRAY SUBSTRATE AND METHOD FOR MANUFACTURING THE SAME, AND DISPLAY DEVICE

This is a National Phase Application filed under 35 U.S.C. 371 as a national stage of PCT/CN2014/081118, filed Jun. 30, 2014, an application claiming the benefit of Chinese Application No. 201310422039.8, filed Sep. 16, 2013, the content of each of which is hereby incorporated by reference in its entirety.

FIELD OF THE INVENTION

The present invention relates to the field of display technology, in particular to an array substrate and a method for manufacturing the same, and a display device.

BACKGROUND OF THE INVENTION

A flat panel display device has characteristics of small volume, low power consumption, no radiation etc., and has gradually replaced a bulky CRT (Cathode Ray Tube) display device so as to occupy a dominant position in the display market. A commonly used flat panel display device includes a LCD (Liquid Crystal Display), a PDP (Plasma Display Panel), or an OLED (Organic Light-Emitting Diode) display device.

In the imaging process, each pixel in the LCD or an active matrix OLED (Active Matrix Organic Light-Emitting diode, abbreviated to AMOLED) display device is driven by a thin film transistor (abbreviated to TFT) integrated into the array substrate, so as to realize the image display. The thin film transistor functions as a light control switch, is critical to realize the display of the LCD or the OLED display device, and is directly related to the development of the display device with high performance.

The LCD may be of a TN (Twisted Nematic) mode, a VA (Vertical Alignment) mode, or an ADSDS (ADvanced Super Dimension Switch) mode, etc. As for the ADSDS mode, the array substrate simultaneously includes a pixel electrode and a common electrode, the electric field generated between edges of slit electrodes in the same plane and the electric field generated between the slit electrode layer and the plate-shaped electrode layer constitute a multidimensional electric field so that all oriented liquid crystal molecules between slit electrodes and directly above the electrodes in the liquid crystal cell are oriented, to improve the operation efficiency of the liquid crystal molecules and increase light transmission efficiency, while increasing the viewing angle.

The thin film transistor mainly includes a gate, a gate insulating layer, an active layer, a source and a drain. FIG. 1 is a sectional view of an array substrate in an ADSDS mode in the prior art. The array substrate is manufactured by five patterning processes (in other words, masking processes) from bottom to top, and the used masks include a mask for the common electrode, a mask for the gate, a mask for the active layer and the source/the drain, a mask for a via in a passivation layer, and a mask for the pixel electrode. In the array substrate, the common electrode and the gate are formed by two patterning processes with a transparent conductive material and a metal material, respectively.

FIG. 2 is a sectional view of an array substrate in another ADSDS mode in the prior art. The array substrate is manufactured by six patterning processes (in other words, masking processes) from bottom to top, and the used masks include a mask for the gate, a mask for the active layer, a mask for the source/the drain, a mask for the pixel electrode, a mask for a via in a passivation layer, and a mask for the common electrode. In the array substrate, the source/the drain and the pixel electrode are formed by two patterning processes with a metal material and a transparent conductive material, respectively.

In the array substrates with the above-mentioned two kinds of structures, the common electrode and the gate, as well as the source/the drain and the pixel electrode are formed by two masking processes, resulting in a complex process and a high cost. Similarly, as for the array substrate in the TN mode, the VA mode and the OLED display device, the same problem also exists.

SUMMARY OF THE INVENTION

The technical problem to be solved by the present invention aims to the above shortages existing in the prior art, to provide an array substrate and a method for manufacturing the same, and a display device, and the array substrate and the corresponding method for manufacturing the array substrate effectively simplify the manufacturing procedure of the array substrate, reduce the cost for mask plate and material, reduce the equipment investment, save the production cost, improve the productivity, and increase the competitiveness of the display device.

A technical solution employed to solve the technical problem of the invention is an array substrate, including a base substrate, and a thin film transistor and at least one driving electrode provided on the base substrate, wherein the thin film transistor includes a gate, and a source/a drain provided in the same layer; and the gate or the source/the drain is a film layer formed of the same material as one driving electrode of the at least one driving electrode, and the thickness thereof is larger than that of the one driving electrode.

In one preferable solution, the at least one driving electrode includes a first electrode and a second electrode, the first electrode and the second electrode at least partially overlap in the orthographic projection direction, and the second electrode is provided below the first electrode; and one of the gate and the source/the drain which is located in the upper layer is a film layer formed of the same material as the first electrode, and the thickness thereof is larger than that of the first electrode; and/or one of the gate and the source/the drain which is located in the lower layer is a film layer formed of the same material as the second electrode, and the thickness thereof is larger than that of the second electrode.

Preferably, the film layer formed of the same material is a mono-layered film layer or a multi-layered composite film layer formed of aluminum, copper, molybdenum, aluminum neodymium alloy, chromium, titanium or silver.

In this case, the at least one driving electrode has a transmittance in a range of 30% to 90%, and has a thickness in a range of 100 Å to 1000 Å.

Preferably, the film layer formed of the same material is a multi-layered composite film layer formed of one-dimensional metal-dielectric photonic crystals; and the metal includes silver, and the dielectric includes zinc sulfide or indium tin oxide.

In this case, the at least one driving electrode has a transmittance in a range of 30% to 90%, and has a thickness in a range of 10 Å to 100 Å.

Preferably, the first electrode is a slit-shaped pixel electrode, the second electrode is a plate-shaped common electrode, and the pixel electrode is electrically connected to the drain; or the first electrode is a slit-shaped common electrode, the second electrode is a plate-shaped pixel electrode, and the pixel electrode is electrically connected to the drain.

In one preferable solution, the driving electrode includes a pixel electrode, the source/the drain is a film layer formed of the same material as the pixel electrode, and the thickness thereof is larger than that of the pixel electrode.

Preferably, the film layer formed of the same material is a mono-layered film layer or a multi-layered composite film layer formed of aluminum, copper, molybdenum, aluminum neodymium alloy, chromium, titanium or silver.

In this case, the pixel electrode is electrically connected to the drain, and the pixel electrode has a transmittance in a range of 30% to 90%, and has a thickness in a range of 10 Å to 100 Å.

Preferably, the film layer formed of the same material is a multi-layered composite film layer formed of one-dimensional metal-dielectric photonic crystals; and the metal includes silver, and the dielectric includes zinc sulfide or indium tin oxide.

In this case, the pixel electrode is electrically connected to the drain, and the pixel electrode has a transmittance in a range of 30% to 90%, and has a thickness in a range of 100 Å to 1000 Å.

A display device includes the above array substrate.

A method for manufacturing an array substrate includes a step of forming a thin film transistor and at least one driving electrode on a base substrate, wherein the thin film transistor includes a gate, and a drain/a source provided in the same layer, and one of the gate and the source/the drain and one driving electrode of the at least one driving electrode are formed by a single patterning process, the one of the gate and the source/the drain is a film layer formed of the same material as the one driving electrode, and has a thickness larger than that of the one driving electrode.

Preferably, one of the gate and the source/the drain and one driving electrode of the at least one driving electrode are formed by a single patterning process as follows:

Step S1: forming a metal electrode layer;

Step S2: forming a photoresist layer on the metal electrode layer;

Step S3: performing exposure and development processes on the photoresist layer using a half tone mask plate or a gray tone mask plate so that photoresist at a region where the one of the gate and the source/the drain is to be formed is completely remained, photoresist at a region where the one driving electrode is to be formed is partially remained, and photoresist at other regions is completely removed;

Step S4: performing a first etching process on the metal electrode layer so that metal electrode material at regions other than the region where the one of the gate and the source/the drain is to be formed and the region where the one driving electrode is to be formed is removed;

Step S5: performing a thinning treatment on the photoresist layer so that photoresist at the region where the one of the gate and the source/the drain is to be formed is partially remained, and photoresist at the region where the one driving electrode is to be formed is completely removed;

Step S6: performing a second etching process on the metal electrode layer so that metal electrode material at the region where the one driving electrode is to be formed is partially removed to form a pattern including the one of the gate and the source/the drain, and the one driving electrode; and Step S7: removing the remaining photoresist in the photoresist layer.

Preferably, the step of forming a metal electrode layer includes forming a mono-layered film layer or a multi-layered composite film layer with aluminum, copper, molybdenum, aluminum neodymium alloy, chromium, titanium or silver In this case, the step of forming a pattern including the one of the gate and the source/the drain, and the one driving electrode includes forming the one driving electrode which has a thickness in a range of 10 Å to 100 Å, and has a transmittance in a range of 30% to 90%.

Preferably, the step of forming a metal electrode layer includes forming a multi-layered composite film layer formed of one-dimensional metal-dielectric photonic crystals, wherein the metal includes silver, and the dielectric includes zinc sulfide or indium tin oxide.

In this case, the step of forming a pattern including the one of the gate and the source/the drain, and the one driving electrode includes forming the one driving electrode which has a thickness in a range of 100 Å to 1000 Å, and has a transmittance in a range of 30% to 90%.

Further preferably, the step of performing a thinning treatment on the photoresist layer includes performing a thinning treatment on the photoresist layer by an ashing process.

Preferably, wherein the at least one driving electrode includes a first electrode and a second electrode, the first electrode and the second electrode at least partially overlap in the orthographic projection direction, and the second electrode is provided below the first electrode, wherein one of the gate and the source/the drain and one driving electrode of the at least one driving electrode are formed by a single patterning process as follows:

one of the gate and the source/the drain which is located in the upper layer, and the first electrode are simultaneously formed by a single patterning process; and/or one of the gate and the source/the drain which is located in the lower layer, and the second electrode are simultaneously formed by a single patterning process.

Further preferably, the first electrode is a slit-shaped pixel electrode, the second electrode is a plate-shaped common electrode, and the pixel electrode is electrically connected to the drain; or the first electrode is a slit-shaped common electrode, the second electrode is a plate-shaped pixel electrode, and the pixel electrode is electrically connected to the drain.

Preferably, the driving electrode includes a pixel electrode, one of the gate and the source/the drain and one driving electrode of the at least one driving electrode are formed by a single patterning process as follows:

the source/the drain and the pixel electrode are simultaneously formed by a single patterning process so that the pixel electrode is electrically connected to the drain.

The advantageous effects of the invention are as follows. In the array substrate of the invention, the gate or the source/the drain is formed with the same material as one driving electrode of the at least one driving electrode, and the thickness thereof is larger than that of the one driving electrode; moreover, the gate or the source/the drain is formed by the same patterning process as the one driving electrode, so that the manufacturing procedure of the array substrate is effectively simplified, the cost for mask plate and material is reduced, the equipment investment is reduced, the production cost is saved, the productivity is improved, and the competitiveness of the display device is increased, while the transmittance is met.

BRIEF DESCRIPTION OF THE DRAWINGS

FIG. 4-1 to FIG. 4-6 are diagrams illustrating a manufacturing procedure of the array substrate in FIG. 3, wherein FIG. 4-1 is a sectional view of a structure formed with a metal electrode layer;

FIG. 4-2 is a sectional view of a structure formed after an exposure and a development are performed on the photoresist layer;

FIG. 4-3 is a sectional view of a structure formed after a first etching process is performed;

FIG. 4-4 is a sectional view of a structure formed after an ashing process is performed;

FIG. 4-5 is a sectional view of a structure formed after a second etching process is performed; and FIG. 4-6 is a sectional view of a structure formed after the remaining photoresist is stripped off.

FIG. 5 is a sectional view of an array substrate in Embodiment 3 of the present invention.

FIG. 6-1 to FIG. 6-7 are diagrams illustrating a manufacturing procedure of the array substrate in FIG. 5, wherein FIG. 6-1 is a sectional view of a structure formed with a metal electrode layer;

FIG. 6-2 is a sectional view of a structure formed after an exposure and a development are performed on the photoresist layer;

FIG. 6-3 is a sectional view of a structure formed after a first etching process is performed;

FIG. 6-4 is a sectional view of a structure formed after an ashing process is performed;

FIG. 6-5 is a sectional view of a structure formed after a second etching process is performed;

FIG. 6-6 is a sectional view of a structure formed after a third etching process is performed; and FIG. 6-7 is a sectional view of a structure formed after the remaining photoresist is stripped off.

FIG. 7 is a sectional view of an array substrate in Embodiment 5 of the present invention.

REFERENCE SIGNS

10—base substrate; 11—gate; 110—gate metal layer; 111—patterned gate metal pattern; 12—gate insulating layer; 13—active layer; 14—source; 15—drain; 140—source/drain metal layer; 141—patterned source/drain metal pattern; 16—passivation layer; 19—photoresist layer; 20—pixel electrode; 21—common electrode; 22—common electrode line; and 23—pixel electrode connection line.

DETAILED DESCRIPTION OF THE EMBODIMENTS

In order to make persons skilled in the art better understand the technical solutions of the invention, the array substrate and the method for manufacturing the array substrate, and the display device will be described in detail below in conjunction with the drawings and the embodiments.

The present invention provides an array substrate, including a base substrate, and a thin film transistor and at least one driving electrode provided on the base substrate, wherein the thin film transistor includes a gate, and a source/a drain (i.e., a source and a drain) provided in the same layer; and the gate or the source/the drain is formed with the same material as one driving electrode of the at least one driving electrode, and the thickness thereof is larger than that of the one driving electrode.

Embodiment 1

The present embodiment provides an array substrate, including a base substrate, and a thin film transistor and a first and second electrodes functioning as driving electrodes which are provided on the base substrate, the thin film transistor includes a gate, and a source/a drain provided in the same layer, the first electrode and the second electrode at least partially overlap in the orthographic projection direction, and the second electrode is provided below the first electrode. In the present embodiment, the thin film transistor is a bottom-gate type thin film transistor, that is, in the thin film transistor, the gate is located in the lower layer, and the source and the drain are located in the upper layer, the first electrode is a slit-shaped pixel electrode, and the second electrode is a plate-shaped common electrode.

Figure 3:
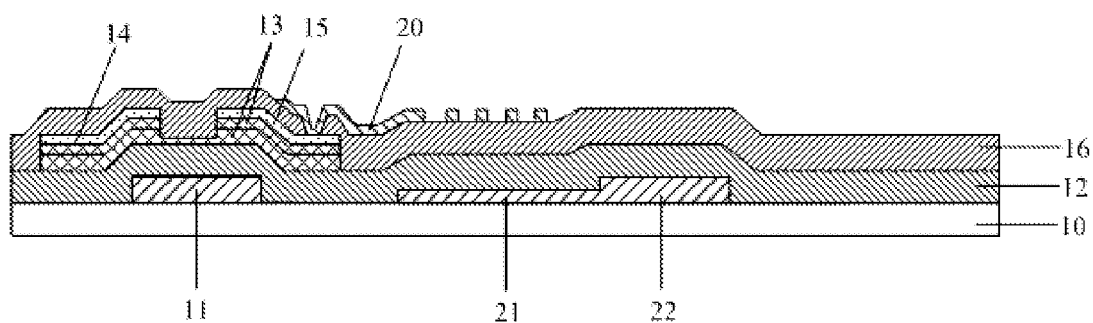
FIG. 3 is a sectional view of an array substrate in Embodiment 1 of the present invention.

In particular, as shown in FIG. 3, in the array substrate, a gate 11 and a common electrode 21 provided in the same layer, a gate insulating layer 12, an active layer 13 (as shown in FIG. 3, the active layer 13 is of a bilayered films structure), a source 14 and a drain 15 provided in the same layer, a passivation layer 16, and a pixel electrode 20 provided above the passivation layer 16 and electrically connected to the drain through a via hole in the passivation layer are successively provided on the base substrate 10. In the present embodiment, the gate 11 is formed with the same material as the common electrode 21, and the thickness thereof is larger than that of the common electrode 21.

Preferably, the gate 11 and the common electrode 21 are mono-layered film layers or multi-layered composite film layers formed of aluminum (Al), copper (Cu), molybdenum (Mo), aluminum neodymium alloy (AlNd), chromium (Cr), titanium (Ti) or silver (Ag). The common electrode 21 has a thickness in a range of 10 Å to 100 Å, and has a transmittance in a range of 30% to 90%.

Correspondingly, a method for manufacturing an array substrate of the present embodiment includes a step of forming a thin film transistor, and a pixel electrode and a common electrode functioning as driving electrodes on the base substrate, and the thin film transistor includes a gate, and a drain/a source provided in the same layer, the common electrode is provided below the pixel electrode, wherein the gate located in the lower layer and the common electrode are simultaneously formed with the same material by a single patterning process, and the thickness of the common electrode is less than that of the gate.

Before the detailed description is set forth, it should be understood that, in the present invention, the patterning process may only include a photolithographic step, or may include a photolithographic step and an etching step, and may also include printing, inkjetting or any other process for forming a predetermined pattern, and the photolithographic process refers to a pattern forming process including steps such as film formation, exposure, development using photoresist, a mask plate, an exposure machine etc. A corresponding patterning process can be selected according to the structure to be formed in the invention.

Particularly, as shown in FIGS. 4-1 to 4-6, the gate and the common electrode are simultaneously formed by a single patterning process with the following steps S1 to S7.

Step S1: forming a metal electrode layer.

Figure 1:
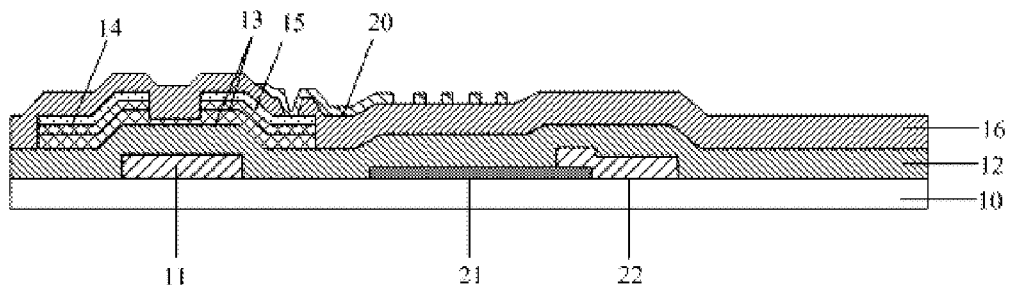
FIGS. 1 and 2 are two sectional views of two kinds of array substrates in the prior art.
Figures 1, 4:
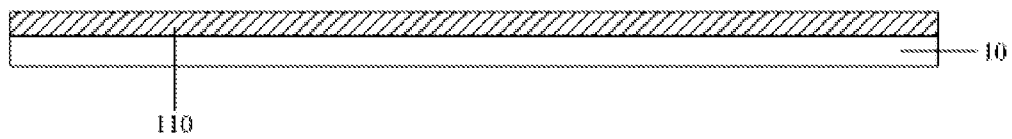
Figures 2, 4:
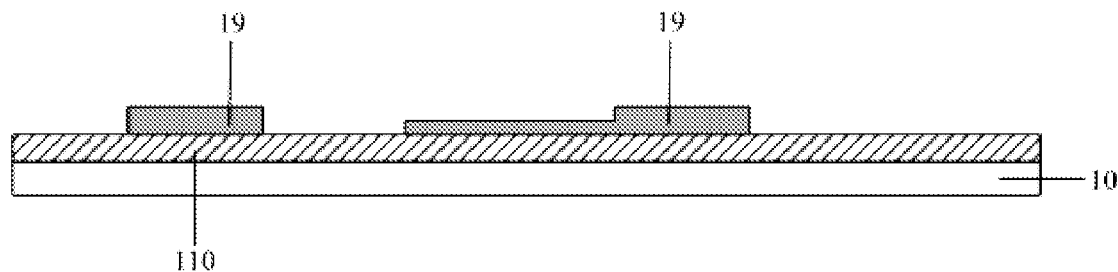
Figures 3, 4:
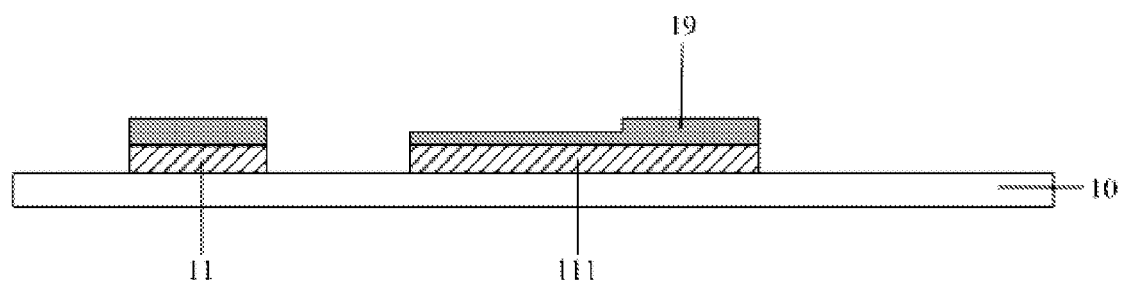
Figure 4:
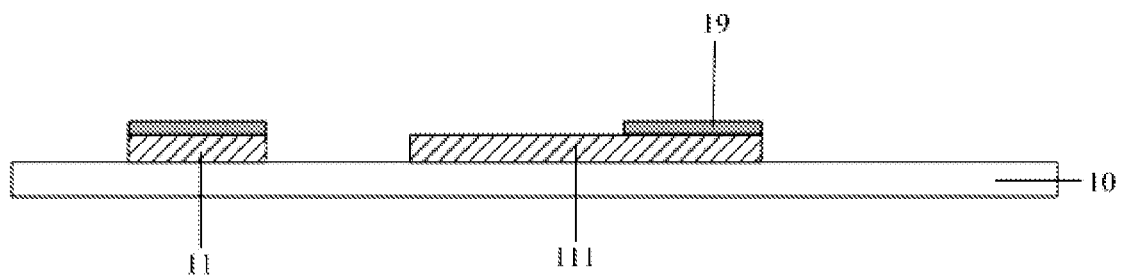

As shown in FIG. 4-1, in this step, the metal electrode layer is formed on the base substrate 10, and particularly a gate metal layer 110 is formed by deposition, sputtering or evaporation. Preferably, the gate metal layer 110 is formed of aluminum (Al), copper (Cu), molybdenum (Mo), aluminum neodymium alloy (AlNd), chromium (Cr), titanium (Ti) or silver (Ag), and in the present invention, the gate metal layer 110 is preferably formed with silver (Ag).

Step S2: forming a photoresist layer on the metal electrode layer.

In this step, the photoresist layer 19 is formed on the gate metal layer 110 by application.

Step S3: performing exposure and development processes on the photoresist layer using a half tone mask plate or a gray tone mask plate so that photoresist at a region where the gate is to be formed is completely remained, photoresist at a region where the common electrode is to be formed is partially remained, and photoresist at other regions is completely removed.

Figure 2:
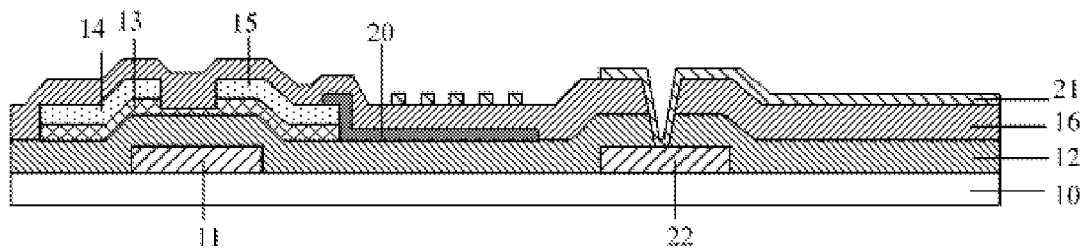

As shown in FIG. 4-2, in this step, exposure is performed on the photoresist layer 19 using a half tone mask plate or a gray tone mask plate so that UV curing reaction occurs completely, partially or not at all in photoresist at different regions of the photoresist layer 19, and photoresist of the photoresist layer 19 at a region where the gate is to be formed is completely remained, photoresist at a region where the common electrode is to be formed is partially remained, and photoresist at the other regions is completely removed after development, that is, the pattern of photoresist on the gate metal layer 110 has different thicknesses at different regions.

Step S4: performing a first etching process on the metal electrode layer so that metal electrode material at regions other than the region where the gate is to be formed and the region where the common electrode is to be formed are removed.

As shown in FIG. 4-3, in this step, a part of the gate metal layer 110 which is not protected by photoresist is etched by the first etching process, to form the gate 11 and a patterned gate metal pattern 111 with a preliminary profile. The patterned gate metal pattern 111 with a preliminary profile will be formed into the common electrode and a common electrode line in the following process, the common electrode is used to drive the liquid crystal molecules to rotate, and the common electrode line is used to transmit an electric signal to the common electrode and is connected to the common electrode.

Step S5: performing a thinning treatment on the photoresist layer so that photoresist at the regions where the gate and the common electrode line are to be formed is partially remained, and photoresist at the region where the common electrode is to be formed is completely removed.

As shown in FIG. 4-4, in this step, the thinning treatment is performed on the photoresist layer 19 by an ashing process to remove photoresist partially, that is, photoresist of the photoresist layer 19 at the region where the driving common electrode is to be formed is removed to expose the patterned gate metal pattern 111 at this region, and photoresist at the region where the common electrode line connected with the common electrode is to be formed is remained to still cover the patterned gate metal at this region. Of course, the thinning treatment performed on photoresist is not limited to the ashing process, and any other thinning process which has the same thinning effects can be used in this step, which is not limited in the present embodiment.

Step S6: performing a second etching process on the metal electrode layer so that metal electrode material at the region where the common electrode is to be formed is partially removed to form a pattern including the gate and the common electrode.

Figures 4, 5:
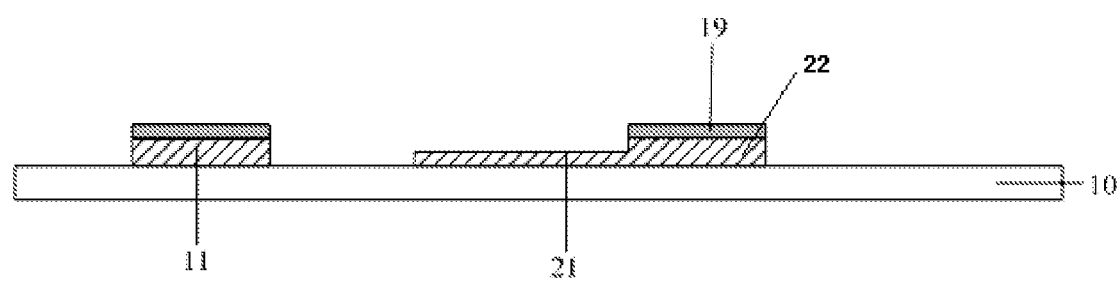

As shown in FIG. 4-5, in this step, the second etching process is performed on a part of the gate metal layer uncovered by photoresist, that is, part of the exposed patterned gate metal pattern 111 with a preliminary profile which will be formed into the common electrode for driving is etched. Since metal electrode material of this part is not covered by photoresist to be exposed, parameters of the etching process could be controlled so that the part of the gate metal layer has a thickness in the range of 10 Å to 100 Å, and has a transmittance in the range of 30% to 90%, that is, the common electrode 21 is formed; as for a part of the gate metal layer which will be formed into the common electrode line connected with the common electrode, since this part is still covered by photoresist, the thickness of metal electrode material of the part is still the thickness of the gate metal layer, that is, the common electrode line 22 is formed, and the common electrode line 22 has the same thickness as the gate 11. Since the common electrode line 22 has a larger thickness relative to the common electrode 21, a better conductivity can be ensured, and a better electric contact can be achieved.

Step S7: removing the remaining photoresist in the photoresist layer.

Figures 4, 5, 6:
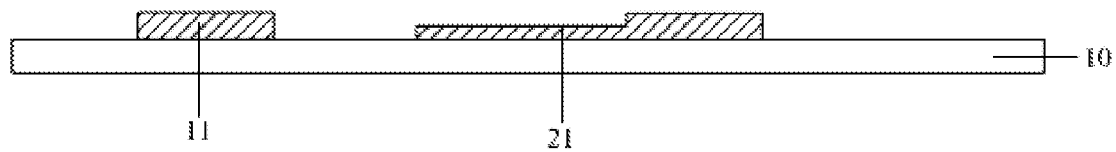
Figure 5:
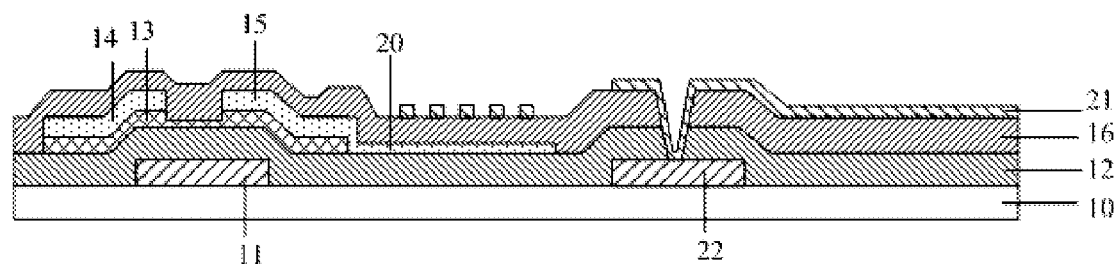

As shown in FIG. 4-6, in this step, all the remaining photoresist is stripped off by a stripping process to be removed completely.

As such, the common electrode and the gate are prepared in the present embodiment.

Preferably, in the present embodiment, the gate 11 has a thickness in the range of 500 to 2000 Å, the thinned common electrode 21 has a thickness of 50 Å, and the common electrode 21 has a transmittance of about 90%. Of course, in the present embodiment, the gate 11 may be a mono-layered metal film layer or a multi-layered composite film layer formed of aluminum (Al), copper (Cu), molybdenum (Mo), aluminum neodymium alloy (AlNd), chromium (Cr), titanium (Ti) or silver (Ag), and the common electrode 21 may be obtained by forming a mono-layered metal film layer or a multi-layered composite film layer with the same material as the gate mentioned above, and then performing an etching process thereon.

Figure 14:
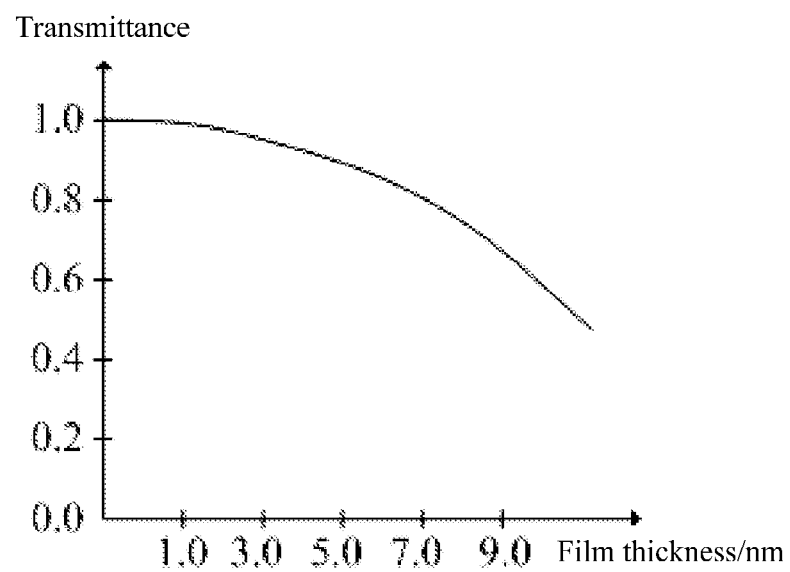
FIG. 14 is a diagram illustrating the relationship between the transmittance and the thickness of the silver (Ag) film.

FIG. 14 is a diagram illustrating the relationship between the transmittance and the thickness of the silver (Ag) film. From FIG. 14, it can be seen that the transmittance is gradually decreased as the thickness of the silver (Ag) film is increased. So, in an actual preparation process, a more balanced and reasonable thickness range can be achieved according to preparation conditions of the process equipment and design requirements on transmittance of the array substrate.

In addition, in the course of manufacturing the array substrate in the present embodiment, data lines and gate lines (not shown in FIG. 3, and FIGS. 4-1 to 4-6) are also formed, and the data lines and the gate lines are arranged crosswise to divide the base substrate 10 into a plurality of pixel regions, and the thin film transistor is arranged in the pixel region.

As shown in FIG. 3, the method for manufacturing the array substrate in the present embodiment further includes forming a gate insulating layer 12 on the common electrode 21 and the gate 11, forming an active layer 13 on the gate insulating layer 12, forming a source 14/a drain 15 on the active layer 13, forming a passivation layer 16 on the source 14/the drain 15, and forming a pixel electrode 20 on the passivation layer 16 so that the pixel electrode 20 is connected to the drain 15. In the present embodiment, the common electrode 21 is plate-shaped, the pixel electrode 20 is slit-shaped, and the pixel electrode 20 is arranged above the common electrode 21, and at least partially overlaps with the common electrode 21 in the orthographic projection direction.

In the present embodiment, the gate insulating layer, the active layer, the source/the drain, the passivation layer and the pixel electrode are formed in the same manner as those in the prior art, which will not be repeated herein.

The present embodiment further provides a display device using the above array substrate, and in the display device, the array substrate includes both a pixel electrode and a common electrode, that is, a display device in an ADSDS mode is formed. The display device could be any product or component which has a display function, such as a liquid crystal panel, electronic paper, a mobile phone, a tablet computer, a TV, a monitor, a notebook computer, a digital photo frame, a navigator.

In the array substrate of the present embodiment, the gate and the common electrode are formed of the same material by a single patterning process using a half tone mask plate or a gray tone mask plate. The thickness of the common electrode is smaller than that of the gate to ensure that the transmittance of the common electrode meets the display requirements of the display device in an ADSDS mode. Compared to the method in the prior art in which the gate and the common electrode are formed by two patterning processes (that is, masking processes) with different materials, one patterning process is saved in the present embodiment, thus effectively simplifying the manufacturing procedure of the array substrate, reducing the cost for mask plate and material, reducing the equipment investment, saving the production cost, improving the productivity, and increasing the competitiveness of the display device.

Embodiment 2

The present embodiment is different from Embodiment 1 in that in the present embodiment, referring to FIG. 3, the gate 11 and the common electrode 21 are formed to be multi-layered composite film layer of one-dimensional metal-dielectric photonic crystals structure; the metal includes silver (Ag), and the dielectric includes zinc sulfide (ZnS) or indium tin oxide (ITO); and the common electrode 21 has a thickness in the range of 100 Å to 1000 Å.

In the present embodiment, the gate 11 is a composite film layer of ZnS/Ag/ZnS/Ag or ITO/Ag/ITO/Ag, wherein ZnS has a thickness in the range of 200 Å to 800 Å, ITO has a thickness in the range of 200 Å to 800 Å, Ag in the inner layer has a thickness in the range of 50 Å to 200 Å, and Ag in the outer layer has a thickness in the range of 500 Å to 2000 Å. For example, respective film layers of the structure of ZnS/Ag/ZnS/Ag have thicknesses of 400 Å/180 Å/400 Å/2000 Å, respectively, and correspondingly, the common electrode 21 is a composite film layer of ZnS/Ag/ZnS or ITO/Ag/ITO, and for example, respective film layers of the structure of ZnS/Ag/ZnS have thicknesses of 400 Å/180 Å/400 Å, respectively.

Correspondingly, in the method for manufacturing the array substrate, taking the gate 11 with a ZnS/Ag/ZnS/Ag structure as an example, in Step S1, when the gate metal layer 110 is formed, film layers of ZnS, Ag, ZnS and Ag are successively formed on the base substrate 10, to form a multi-layered composite film layer as the gate metal layer 110. Particularly, the film layers of ZnS, Ag, ZnS and Ag are formed by deposition, sputtering or evaporation.

In Step S6, Ag film layer at the surface layer of the gate metal layer 110 is removed by an etching process, so as to obtain the common electrode 21 for driving the liquid crystal molecules to rotate and ensure the transmittance of the common electrode 21, and the common electrode 21 is a composite film layer of ZnS/Ag/ZnS, and the gate 11 and the common electrode line 22 remain to be a composite film layer of ZnS/Ag/ZnS/Ag.

In the present embodiment, other structures of the array substrate are the same as those in Embodiment 1 and will not be repeated herein.

Figure 15:
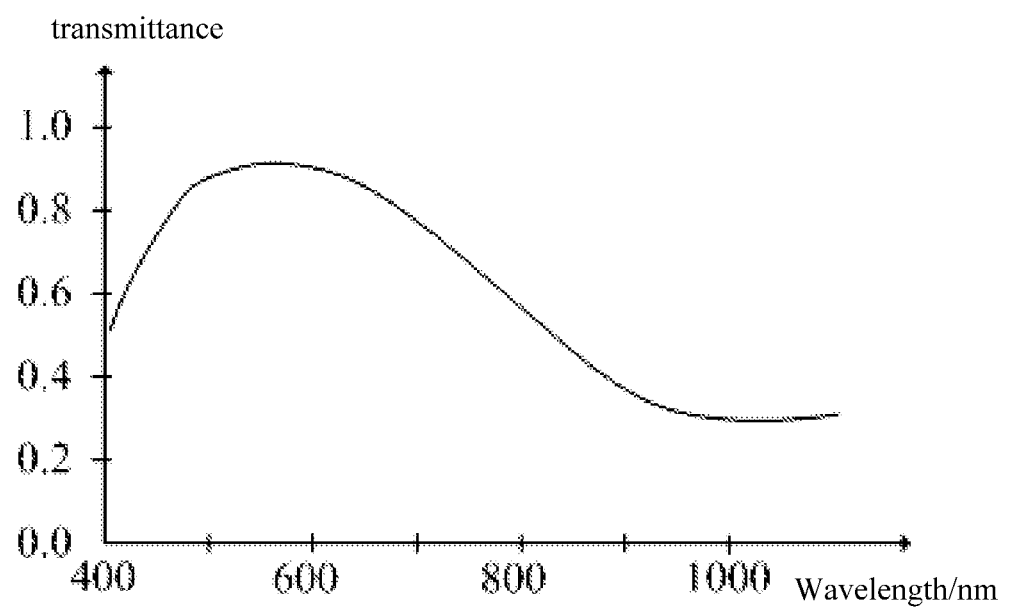
FIG. 15 is a diagram illustrating the relationship between the transmittance and the thickness of one-dimensional metal-dielectric photonic crystal.

In the present embodiment, when the common electrode is of a composite film layer of ZnS/Ag/ZnS, the transmittance curve in the visible light range thereof is shown in FIG. 15, wherein the largest transmittance approaches about 90% ($\lambda=550$ nm).

The present embodiment further provides a display device using the above array substrate.

Embodiment 3

Compared to Embodiment 1, the thin film transistor in the array substrate according to the present embodiment is still of a bottom-gate type, the driving electrodes also include the first electrode and the second electrode, the second electrode is provided below the first electrode, the first electrode is a slit-shaped common electrode, and the second electrode is a plate-shaped pixel electrode. In the present embodiment, the source/the drain are formed with the same material as the pixel electrode, and the thickness thereof is larger than that of pixel electrode.

As shown in FIG. 5, the array substrate of the present embodiment includes a gate 11 formed on the base substrate 10, a gate insulating layer 12 formed on the gate 11, an active layer 13 formed on the gate insulating layer 12, a source 14/a drain 15 and a pixel electrode 20 formed on the active layer 13 (the pixel electrode 20 is electrically connected to the drain 15 directly), a passivation layer 16 formed on the source 14/the drain 15 and the pixel electrode 20, and a common electrode 21 formed on the passivation layer 16. In the present embodiment, the pixel electrode 20 is plate-shaped, the common electrode is slit-shaped, and the common electrode 21 is opposite to the pixel electrode 20 and arranged thereabove, and at least partially overlaps with the pixel electrode 20 in the orthographic projection direction.

Correspondingly, in the method for manufacturing the array substrate according to the present embodiment, the source 14/the drain 15 and the pixel electrode 20 are simultaneously formed by a single patterning process with the same material, and the thickness of the pixel electrode 20 is smaller than that of the source 14/the drain 15.

Figures 1, 6:
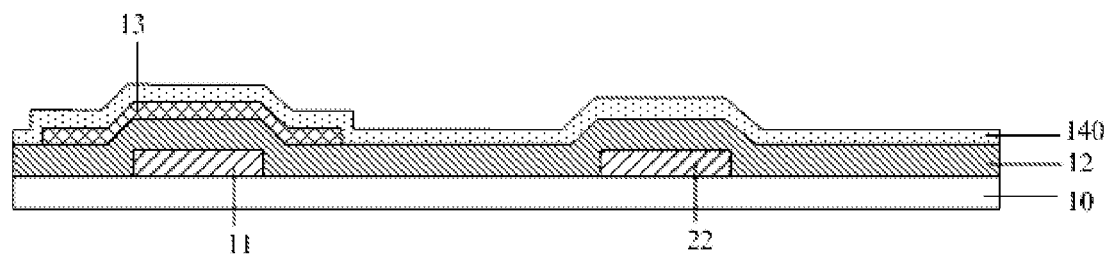
Figures 2, 6:
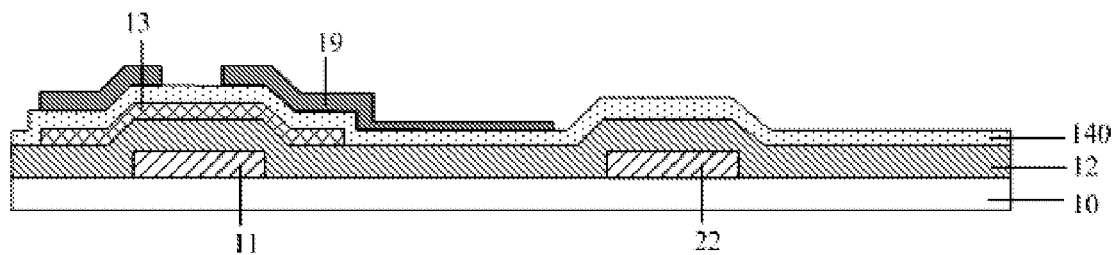
Figures 3, 6:
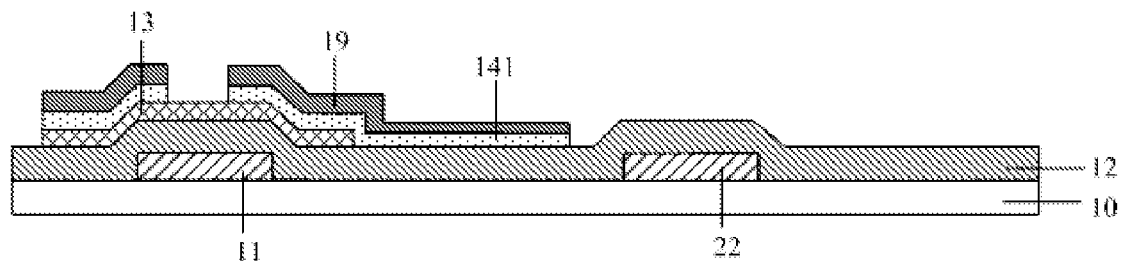
Figures 4, 6:
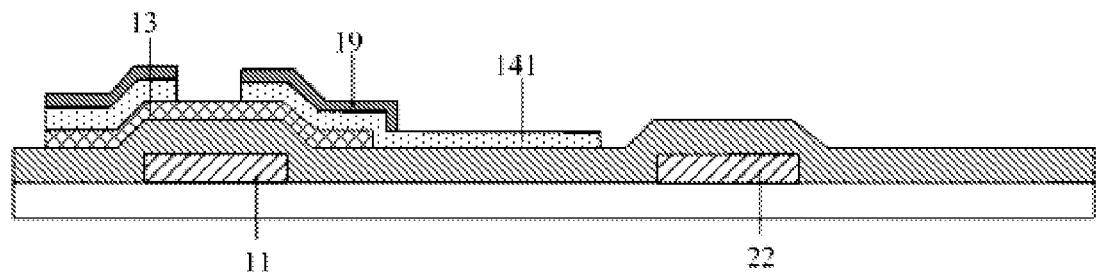
Figures 5, 6:
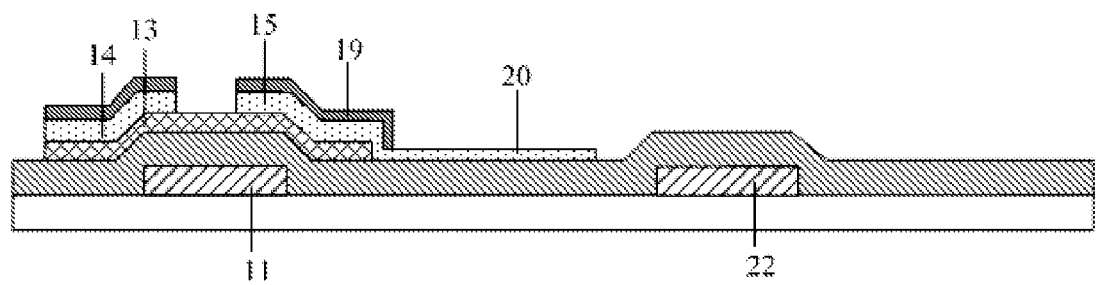
Figure 6:
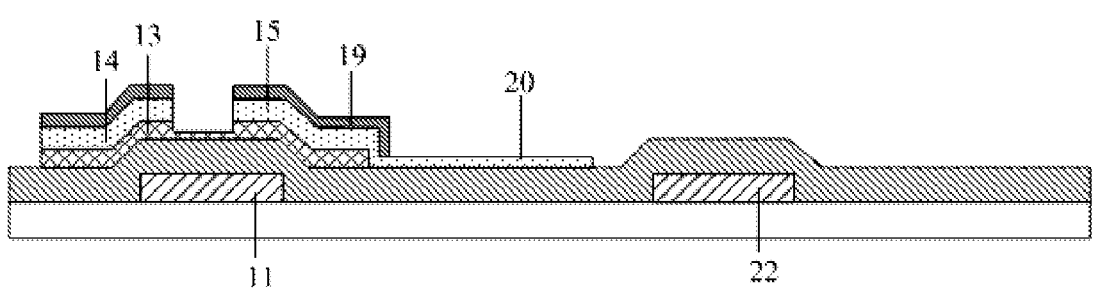
Figures 6, 7:
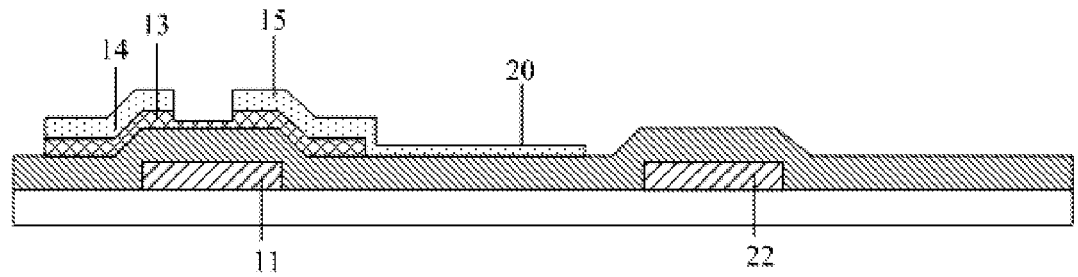
Figure 7:
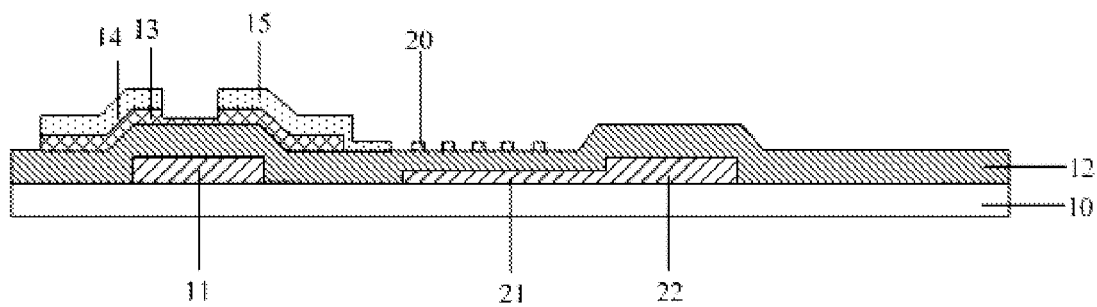

Particularly, as shown in FIGS. 6-1 to 6-7, the source 14/the drain 15 and the pixel electrode 20 are simultaneously formed by a single patterning process with the following steps S1 to S7.

Step S1: forming a metal electrode layer.

As shown in FIG. 6-1, the array substrate has been already provided with the gate 11, the gate insulating layer 12 and the active layer 13. In this step, the metal electrode layer is formed on the active layer 13, and particularly, a source/drain metal layer 140 is formed by deposition, sputtering or evaporation. Preferably, the source/drain metal layer 140 is formed of aluminum (Al), copper (Cu), molybdenum (Mo), aluminum neodymium alloy (AlNd), chromium (Cr), titanium (Ti) or silver (Ag), and in the present invention, the source/drain metal layer is preferably formed with silver (Ag)

Step S2: forming a photoresist layer on the metal electrode layer.

In this step, the photoresist layer 19 is formed on the source/drain metal layer 140 by application.

Step S3: performing exposure and development processes on the photoresist layer using a half tone mask plate or a gray tone mask plate so that photoresist at regions where the source/the drain are to be formed is completely remained, photoresist at a region where the pixel electrode is to be formed is partially remained, and photoresist at other regions is completely removed.

As shown in FIG. 6-2, in this step, exposure is performed on the photoresist layer 19 using a half tone mask plate or a gray tone mask plate so that UV curing reaction occurs completely, partially or not at all in photoresist at different regions of the photoresist layer 19, and photoresist of the photoresist layer 19 at the regions where the source/the drain are to be formed is completely remained, photoresist at the region where the pixel electrode is to be formed is partially remained, and photoresist at other regions is completely removed after development, that is, the pattern of photoresist on the source/drain metal layer 140 has different thicknesses at different regions.

Step S4: performing a first etching process on the metal electrode layer so that metal electrode material at regions other than the regions where the source/the drain are to be formed and the region where the pixel electrode is to be formed are removed.

As shown in FIG. 6-3, in this step, a part of the source/drain metal layer 140 which is not protected by photoresist is etched by the first etching process, to form a patterned source/drain metal pattern 141 with a preliminary profile. The patterned source/drain metal pattern 141 with a preliminary profile will be formed into the pixel electrode and the source/the drain in the following process, and moreover, after the first etching process, a trench or spacing is already formed in the patterned source/drain meta pattern 141 on the active layer 13, and the subsequently formed source and drain are arranged at opposite sides of the trench or spacing.

Step S5: performing a thinning treatment on the photoresist layer so that photoresist at the regions where the source/the drain are to be formed is partially remained, and photoresist at the region where the pixel electrode is to be formed is completely removed.

As shown in FIG. 6-4, in this step, the thinning treatment is performed on photoresist by an ashing process (for example, plasma treatment is directly performed using gas) to remove the partially remained photoresist (i.e. photoresist at the region of the photoresist layer 19 where the pixel electrode is to be formed) so that a part of the patterned source/drain metal pattern 141 at the region is exposed, and photoresist at regions where the source/the drain are to be formed are remained to still cover the part of the patterned source/drain metal pattern 141 at these regions. Similarly, the thinning treatment performed on photoresist is not limited to the ashing process, while any other thinning process which has the same thinning effects can be used in this step, which is not limited in the present embodiment.

Step S6: performing a second etching process on the metal electrode layer so that metal electrode material at the region where the driving electrode is to be formed is partially removed to form a pattern including the source/the drain and the pixel electrode.

As shown in FIG. 6-5, in this step, the second etching process is performed on the part of the source/drain metal pattern unprotected (uncovered) by photoresist, and parameters of the etching process could be controlled so that the a pixel electrode 20 with a thickness in the range of 10 Å to 100 Å, and with a transmittance in the range of 30% to 90% is formed.

In order to further form a conductive region defined between the source and the drain (i.e. to form a semiconductor part corresponding to a gap between the drain and the source when the thin film transistor is turned on under a gate voltage), in the present embodiment, the method further includes a third etching process after the pixel electrode 20 is formed. As shown in FIG. 6-6, an n+ etching is performed on a region of the active layer 13 corresponding to the trench or spacing in the patterned source/drain metal pattern 141 (the active layer 13 in FIGS. 6-1 to 6-7 could be of a bilayered films structure, the same as in the prior art), so that the actual source 14 and drain 15 are formed, and the pixel electrode 20 is electrically connected to the drain 15 directly.

Step S7: removing the remaining photoresist in the photoresist layer.

As shown in FIG. 6-7, in this step, all the remaining photoresist is stripped off by a stripping process to be removed completely.

As such, the source 14/the drain 15 and the pixel electrode 20 are prepared in the present embodiment.

Preferably, in the present embodiment, the source 14/the drain 15 have thicknesses in the range of 500 to 2000 Å, the thinned pixel electrode 20 has a thickness of 50 Å, and the pixel electrode 20 has a transmittance of about 90%. In the present embodiment, the source 14/the drain 15 may be a mono-layered metal film layer or a multi-layered composite film layer formed of aluminum (Al), copper (Cu), molybdenum (Mo), aluminum neodymium alloy (AlNd), chromium (Cr), titanium (Ti) or silver (Ag), and the pixel electrode 20 may be obtained by forming a mono-layered metal film layer or a multi-layered composite film layer with the same material as the source/the drain mentioned above, and then performing an etching process thereon.

In addition, as shown in FIG. 5, the method for manufacturing the array substrate in the present embodiment further includes: forming a passivation layer 16 on the source 14/the drain 15 and the pixel electrode 20, and forming a common electrode 21 on the passivation layer 16 so that the common electrode 21 is electrically connected to a common electrode line 22 through a via hole in the gate insulating layer 12 and a via hole in the passivation layer 16. In the present embodiment, the pixel electrode 20 is plate-shaped, the common electrode 21 is slit-shaped, and the common electrode 21 is opposite to the pixel electrode 21 and arranged thereabove, and at least partially overlaps with the pixel electrode 20 in the orthographic projection direction.

In the present embodiment, the gate, the gate insulating layer, the active layer, the passivation layer and the common electrode are formed in the same manner as those in the prior art, which will not be repeated herein.

The same as Embodiment 1, the present embodiment further provides a display device in an ADSDS mode. In practical, the present embodiment is a modification of Embodiment 1. In a display device in an ADSDS mode, the pixel electrode in the array substrate may be plate-shaped or slit-shaped, and correspondingly, the common electrode may be slit-shaped or plate-shaped. The display device in an ADSDS mode has advantages such as high resolution, high transmittance, low power consumption, wide viewing angle, high aperture ratio, low chromatic aberration, no push Mura, and has a better image quality.

In the array substrate of the present embodiment, the source/the drain and the pixel electrode are formed of the same material by a single patterning process with a half tone mask plate or a gray tone mask plate. The thickness of the pixel electrode is smaller than that of the source/the drain to ensure that the transmittance of the pixel electrode meets the display requirements of the display device in an ADSDS mode. Compared to the method in the prior art in which the source/the drain and the pixel electrode are formed by two patterning processes with different materials, one patterning process is saved in the present embodiment, thus effectively simplifying the manufacturing procedure of the array substrate, reducing the cost for mask plate and material, reducing the equipment investment, saving the production cost, improving the productivity, and increasing the competitiveness of the display device.

Embodiment 4

The present embodiment is different from Embodiment 3 in that in the present embodiment, referring to FIG. 5, the source 14/the drain 15 and the pixel electrode 20 are formed to be multi-layered composite film layer of one-dimensional metal-dielectric photonic crystals structure; the metal includes silver (Ag), and the dielectric includes zinc sulfide (ZnS) or indium tin oxide (ITO); and the pixel electrode 20 has a thickness in the range of 100 Å to 1000 Å.

In the present embodiment, the source 14/the drain 15 is a composite film layer of ZnS/Ag/ZnS/Ag or ITO/Ag/ITO/Ag, wherein ZnS has a thickness in the range of 200 Å to 800 Å, ITO has a thickness in the range of 200 Å to 800 Å, Ag in the inner layer has a thickness in the range of 50 Å to 200 Å, and Ag in the outer layer has a thickness in the range of 500 Å to 2000 Å. For example, respective film layers of the structure of ZnS/Ag/ZnS/Ag have thicknesses of 400 Å/180 Å/400 Å/2000 Å, respectively, and correspondingly, the pixel electrode 20 is a composite film layer of ZnS/Ag/ZnS or ITO/Ag/ITO, and for example, respective film layers of the structure of ZnS/Ag/ZnS have thicknesses of 400 Å/180 Å/400 Å, respectively.

Correspondingly, in the method for manufacturing the array substrate, taking the source 14/the drain 15 with a ZnS/Ag/ZnS/Ag structure as an example, in Step S1, when the source/drain metal layer 140 is formed, film layers of ZnS, Ag, ZnS and Ag are successively formed on the active layer 13, to form the above multi-layered composite film layer as the source/drain metal layer 140. Particularly, the film layers of ZnS, Ag, ZnS and Ag are formed by deposition, sputtering or evaporation.

In Step S6, Ag film layer at the surface layer of the source/drain metal layer 140 is removed by an etching process, so as to obtain the driving pixel electrode 20 of a ZnS/Ag/ZnS composite film layer structure, and the source 14/the drain 15 remain to be a composite film layer of ZnS/Ag/ZnS/Ag.

In the present embodiment, other structures of the array substrate are the same as those in Embodiment 3 and will not be repeated herein.

The present embodiment further provides a display device using the above array substrate.

Embodiment 5

Compared to any one of Embodiment 1 to Embodiment 4, the thin film transistor in the array substrate according to the present embodiment is still of a bottom-gate type, and the driving electrodes also include the common electrode and the pixel electrode. In the present embodiment, the source/the drain are formed with the same material as the pixel electrode, and the thickness thereof is larger than that of pixel electrode; moreover, the gate and the common electrode are formed with the same material, and the thickness of the common electrode is smaller than that of the gate.

As shown in FIG. 7, in the present embodiment, the gate and the common electrode are formed in the same manner as that in Embodiment 1 or Embodiment 2, the source/the drain and the pixel electrode are formed in the same manner as that in Embodiment 3 or Embodiment 4, and the gate insulating layer, the active layer, and the passivation layer are formed in the same manner as those in the prior art, which will not be repeated herein.

In the present embodiment, the transmittance of the pixel electrode is in the range of 30% to 90%, when the pixel electrode is formed of aluminum, copper, molybdenum, aluminum neodymium alloy, chromium, titanium or silver, the pixel electrode has a thickness in the range of 10 Å to 100 Å, and when the pixel electrode is formed with one-dimensional metal-dielectric photonic crystals, the pixel electrode has a thickness in the range of 100 Å to 1000 Å; the transmittance of the common electrode is in the range of 30% to 90%, when the common electrode is formed of aluminum, copper, molybdenum, aluminum neodymium alloy, chromium, titanium or silver, the common electrode has a thickness in the range of 10 Å to 100 Å, and when the common electrode is formed with one-dimensional metal-dielectric photonic crystals, the common electrode has a thickness in the range of 100 Å to 1000 Å.

The present embodiment further provides a display device using the above array substrate.

In the array substrate of the present embodiment, the gate and the common electrode are formed of the same material by a single patterning process using a half tone mask plate or a gray tone mask plate, and the thickness of the common electrode is smaller than that of the gate, and the source/the drain and the pixel electrode are formed of the same material by a single patterning process using a half tone mask plate or a gray tone mask plate, and the thickness of the pixel electrode is smaller than that of the source/the drain, so as to ensure that the transmittance of the common and pixel electrodes meets the display requirements of the display device in an ADSDS mode. Compared to the method in the prior art in which the source/the drain and the pixel electrode as well as the gate and the common electrode are formed by two patterning processes with different materials, respectively, two patterning processes are saved in the present embodiment, thus effectively simplifying the manufacturing procedure of the array substrate, reducing the cost for mask plate and material, reducing the equipment investment, saving the production cost, improving the productivity, and increasing the competitiveness of the display device.

Embodiment 6

Compared to Embodiment 1 or Embodiment 2, the thin film transistor in the array substrate of the present embodiment is of a top-gate type, the driving electrodes also include the common electrode and the pixel electrode, and the common electrode and the pixel electrode at least partially overlap in the orthographic projection direction.

In the thin film transistor in the array substrate according to the present embodiment, among the gate, the source and the drain, the source and the drain are located in the lower layer, the gate is located in the upper layer, and the second electrode is provided below the first electrode, wherein the first electrode is a slit-shaped common electrode, and the second electrode is a plate-shaped pixel electrode. The source/the drain and the pixel electrode are formed of the same material, and the thickness of the pixel electrode is smaller than that of the source/the drain.

Figure 8:
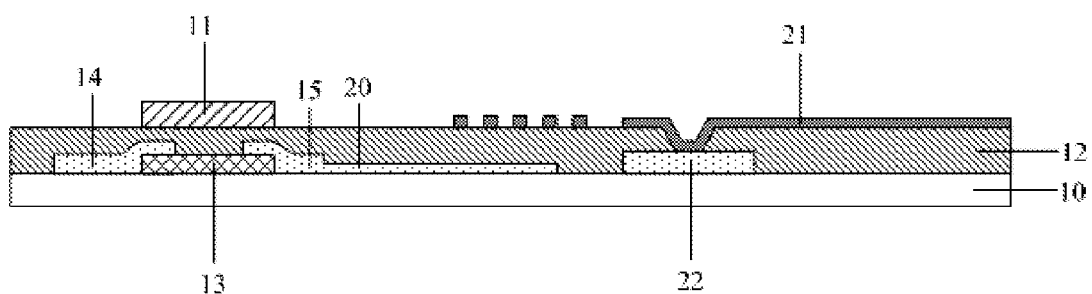
FIG. 8 is a sectional view of an array substrate in Embodiment 6 of the present invention.

Particularly, as shown in FIG. 8, in the array substrate, an active layer 13, a source 14 and a drain 15 provided in the same layer, a gate insulating layer 12 and a gate 11 are successively provided on the base substrate 10. In addition, the pixel electrode 20 and the source 14/the drain 15 are provided in the same layer (the pixel electrode 20 is electrically connected to the drain 15 directly), and the common electrode 21 and the gate 11 are provided in the same layer.

In the present embodiment, the source 14/the drain 15 and the pixel electrode 20 are formed by a single patterning process with the same material. The source 14/the drain 15 may be a mono-layered metal film layer or a multi-layered composite film layer formed of aluminum (Al), copper (Cu), molybdenum (Mo), aluminum neodymium alloy (AlNd), chromium (Cr), titanium (Ti) or silver (Ag), and the pixel electrode 20 may be obtained by forming a mono-layered metal film layer or a multi-layered composite film layer with the same material as the source 14/the drain 15 mentioned above, and then performing a thinning treatment thereon by etching. In the present embodiment, the pixel electrode 20 has a thickness in the range of 10 Å to 100 Å, and a transmittance in the range of 30% to 90%.

Alternatively, the source 14/the drain 15 is a composite film layer of ZnS/Ag/ZnS/Ag or ITO/Ag/ITO/Ag, and preferably respective film layers thereof have thicknesses of 400 Å/180 Å/400 Å/2000 Å; the pixel electrode 20 is a composite film layer of ZnS/Ag/ZnS or ITO/Ag/ITO, and preferably respective film layers thereof have thicknesses of 400 Å/180 Å/400 Å.

The method for manufacturing the respective layers in the array substrate according to the present embodiment may refer to Embodiment 1 or Embodiment 2, and will not be repeated herein.

The same as Embodiment 1 and Embodiment 2, the present embodiment further provides a display device in an ADSDS mode.

Embodiment 7

Compared to Embodiment 3 and Embodiment 4, the thin film transistor in the array substrate of the present embodiment is of a top-gate type, the driving electrodes also include the common electrode and the pixel electrode, and the common electrode and the pixel electrode at least partially overlap in the orthographic projection direction.

In the thin film transistor in the array substrate according to the present embodiment, among the gate, the source and the drain, the source and the drain are located in the lower layer, the gate is located in the upper layer, and the second electrode is provided below the first electrode, wherein the first electrode is a slit-shaped common electrode, and the second electrode is a plate-shaped pixel electrode. The gate and the common electrode are formed of the same material, and the thickness of the common electrode is smaller than that of the gate.

Figure 9:
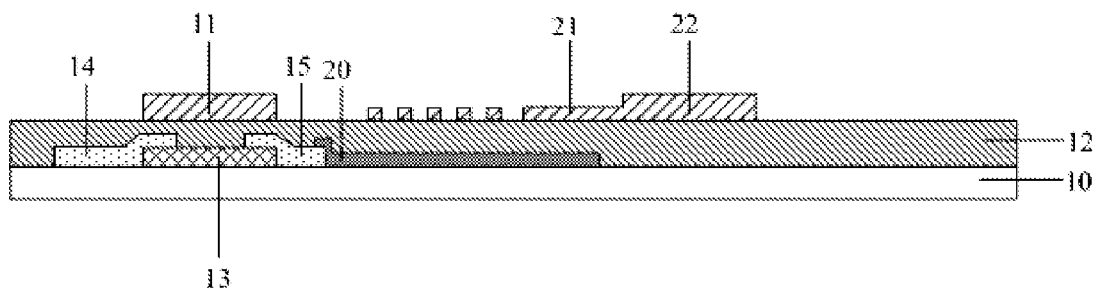
FIG. 9 is a sectional view of an array substrate in Embodiment 7 of the present invention.

Particularly, as shown in FIG. 9, in the array substrate, an active layer 13, a source 14 and a drain 15 provided in the same layer, a gate insulating layer 12 and a gate 11 are successively provided on the base substrate 10. In addition, a pixel electrode 20 and the source 14/the drain 15 are provided in the same layer (the pixel electrode 20 is electrically connected to the drain 15 directly), and the common electrode 21 and the gate 11 are provided in the same layer.

In the present embodiment, the common electrode 21 and the gate 11 are formed by a single patterning process with the same material. The gate 11 may be a mono-layered metal film layer or a multi-layered composite film layer formed of aluminum (Al), copper (Cu), molybdenum (Mo), aluminum neodymium alloy (AlNd), chromium (Cr), titanium (Ti) or silver (Ag), and the common electrode 21 may be obtained by forming a mono-layered metal film layer or a multi-layered composite film layer with the same material as the gate 11 mentioned above, and then performing a thinning treatment thereon by etching. In the present embodiment, the common electrode 21 has a thickness in the range of 10 Å to 100 Å, and a transmittance in the range of 30% to 90%.

Alternatively, the gate 11 is a composite film layer of ZnS/Ag/ZnS/Ag or ITO/Ag/ITO/Ag, and preferably respective film layers thereof have thicknesses of 400 Å/180 Å/400 Å/2000 Å; the common electrode 21 is a composite film layer of ZnS/Ag/ZnS or ITO/Ag/ITO, and preferably respective film layers thereof have thicknesses of 400 Å/180 Å/400 Å.

The method for manufacturing the respective layers in the array substrate according to the present embodiment may refer to Embodiment 3 or Embodiment 4, and will not be repeated herein.

The same as Embodiment 3 and Embodiment 4, the present embodiment further provides a display device in an ADSDS mode.

Embodiment 8

Compared to any one of Embodiment 6 and Embodiment 7, the thin film transistor in the array substrate of the present embodiment is of a top-gate type, and the driving electrodes also include the common electrode and the pixel electrode. In the present embodiment, the source/the drain and the pixel electrode are formed of the same material, and the thickness of the pixel electrode is smaller than that of the source/the drain; and the gate and the common electrode are formed of the same material, and the thickness of the common electrode is smaller than that of the gate.

Figure 10:
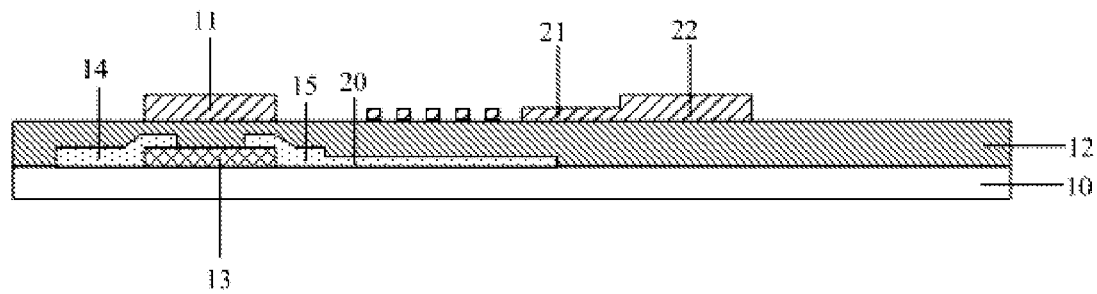
FIG. 10 is a sectional view of an array substrate in Embodiment 8 of the present invention.

Particularly, as shown in FIG. 10, in the array substrate, an active layer 13, a source 14 and a drain 15 provided in the same layer, a gate insulating layer 12 and a gate 11 are successively provided on the base substrate 10, and a pixel electrode 20 and the source 14/the drain 15 are provided in the same layer (the pixel electrode 20 is electrically connected to the drain 15 directly), and a common electrode 21 and the gate 11 are provided in the same layer.

In the present embodiment, the source/the drain and the pixel electrode are formed in the same manner as that in Embodiment 6, the gate and the common electrode are formed in the same manner as that in Embodiment 7, and the gate insulating layer, the active layer and the passivation layer are formed in the same manner as those in the prior art, which will not be repeated herein.

The same e Embodiment 6 and Embodiment 7, the present embodiment further provides a display device in an ADSDS mode.

Embodiment 9

The present embodiment is different from any one of Embodiment 1 to Embodiment 8 in that, the thin film transistor in the array substrate is of a bottom-gate type, and the driving electrodes also include a common electrode and a pixel electrode. In the present embodiment, the gate and the pixel electrode are formed of the same material, and the thickness of the pixel electrode is smaller than that of the gate.

Figure 11:
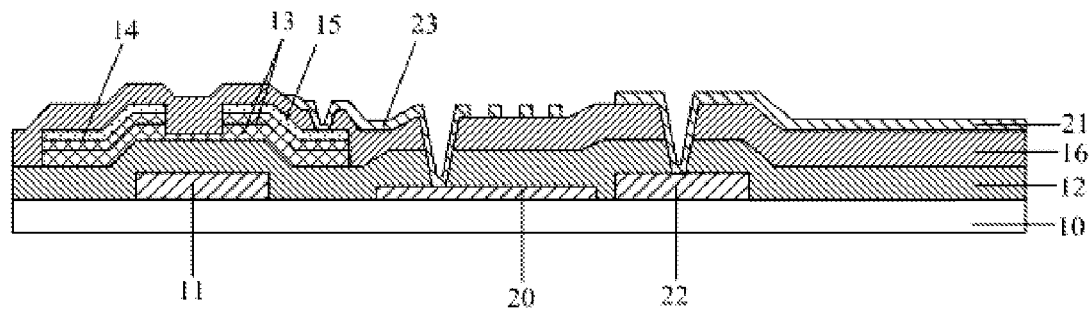
FIG. 11 is a sectional view of an array substrate in Embodiment 9 of the present invention.

Particularly, as shown in FIG. 11, according to the present embodiment, in the array substrate, a gate 11, a gate insulating layer 12, an active layer 13 (as shown in FIG. 11, the active layer 13 is of a bilayered films structure), and a source 14 and a drain 15 provided in the same layer are successively provided on the base substrate 10, and in addition, the pixel electrode 20 and the gate 11 are provided in the same layer (the pixel electrode 20 is electrically connected to the drain 15 by a pixel electrode connection line 23).

In the present embodiment, the pixel electrode connection line 23 for connecting the pixel electrode 20 with the drain 15, and the common electrode 21 are formed of the same material by a single patterning process, and a common electrode line 22 connected to the common electrode 21, the gate 11 and the pixel electrode 20 are formed of the same material by a single patterning process.

In the present embodiment, the method for forming the gate and the pixel electrode may refer to Embodiment 1 to Embodiment 5, and the common electrode, the gate insulating layer, the active layer, and the passivation layer are formed in the same manner as those in the prior art, which will be omitted herein.

The same as Embodiment 1 to Embodiment 8, the present embodiment further provides a display device in an ADSDS mode.

Embodiment 10

The present embodiment is different from any one of Embodiment 1 to Embodiment 9 in that, the thin film transistor in the array substrate according to the present embodiment is of a bottom-gate type, and the array substrate has only one driving electrode (i.e. the first electrode), and the first electrode is a pixel electrode.

Figure 12:
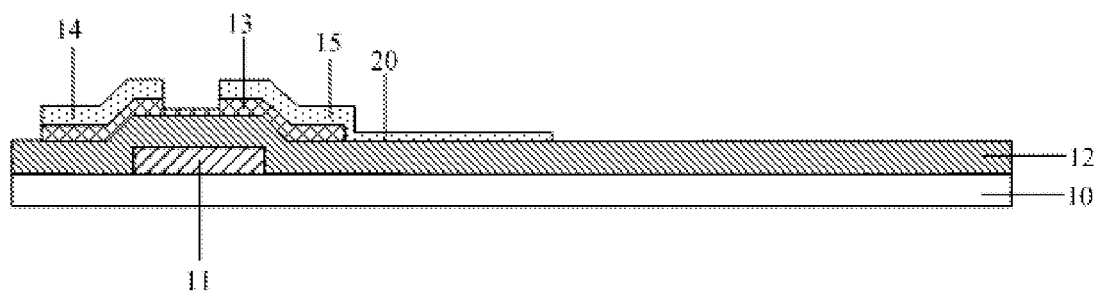
FIG. 12 is a sectional view of an array substrate in Embodiment 10 of the present invention.

Particularly, as shown in FIG. 12, in the array substrate, a gate 11, a gate insulating layer 12, an active layer 13, and a source 14 and a drain 15 provided in the same layer are successively arranged on the base substrate 10, and the pixel electrode 20 and the source 14/the drain 15 are provided in the same layer (the pixel electrode 20 is electrically connected to the drain 15 directly).

In the present embodiment, the source/the drain located in the upper layer, and the pixel electrode are formed of the same material, the thickness of the pixel electrode is smaller than that of the source/the drain, the pixel electrode is electrically connected to the drain, and the pixel electrode has a transmittance in the range of 30% to 90%.

In the present embodiment, the source/the drain and the pixel electrode are mono-layered metal film layer or multi-layered composite film layer formed of aluminum, copper, molybdenum, aluminum neodymium alloy, chromium, titanium or silver, or the source/the drain and the pixel electrode are multi-layered composite film layers formed of one-dimensional metal-dielectric photonic crystals, the metal includes silver, and the dielectric includes zinc sulfide or indium tin oxide.

In the array substrate of the present embodiment, the source/the drain and the pixel electrode are formed by a single patterning process. The particular method for forming the source/the drain and the pixel electrode may refer to any of Embodiment 3 to Embodiment 5.

In the present embodiment, the gate, the gate insulating layer, the active layer and the passivation layer are formed in the same manner as those in the prior art, which will not be repeated herein.

The present embodiment further provides a display device using the above array substrate. The display device may be a TN (Twisted Nematic) LCD, a VA (Vertical Alignment) LCD, or an OLED display device.

Embodiment 11

The present embodiment is different from Embodiment 10 in that, the thin film transistor of the array substrate according to the present embodiment is of a top-gate type, and the array substrate has only one driving electrode (i.e. the first electrode), and the first electrode is a pixel electrode.

Figure 13:
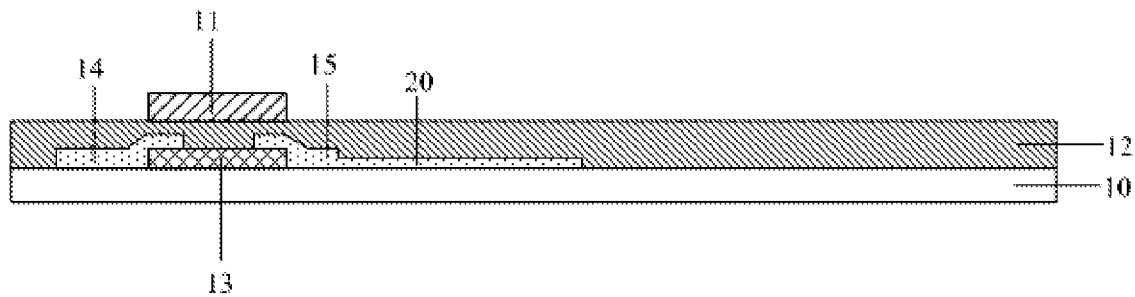
FIG. 13 is a sectional view of an array substrate in Embodiment 11 of the present invention.

Particularly, as shown in FIG. 13, in the array substrate, an active layer 13, a source 14 and a drain 15 provided in the same layer, a gate insulating layer 12, and a gate 11 are successively arranged on the base substrate 10, the pixel electrode 20 and the source 14/the drain 15 are provided in the same layer, and the pixel electrode 20 is electrically connected to the drain 15 directly.

In the present embodiment, the source/the drain located in the lower layer, and the pixel electrode are formed of the same material, the thickness of the pixel electrode is smaller than that of the source/the drain, the pixel electrode is electrically connected to the drain directly, and the pixel electrode has a transmittance in the range of 30% to 90%.

In the present embodiment, the source/the drain and the pixel electrode are mono-layered metal film layers or multi-layered composite film layers formed of aluminum, copper, molybdenum, aluminum neodymium alloy, chromium, titanium or silver, or the source/the drain and the pixel electrode are multi-layered composite film layers formed of one-dimensional metal-dielectric photonic crystals, the metal includes silver, and the dielectric includes zinc sulfide or indium tin oxide.

In the array substrate of the present embodiment, the source/the drain and the pixel electrode are formed by a single patterning process. The particular method for forming the source/the drain and the pixel electrode may refer to Embodiment 6 or Embodiment 8.

In the present embodiment, the gate, the gate insulating layer, the active layer and the passivation layer are formed in the same manner as those in the prior art, which will not be repeated herein.

The present embodiment further provides a display device using the above array substrate.

The pixel electrode or the common electrode is formed with the same material as the gate or the source/the drain of the thin film transistor in the array substrate of the present invention, and in the method for manufacturing the array substrate, the pixel electrode or the common electrode and the gate or the source/the drain in the thin film transistor are formed by a single patterning process, and a thinning treatment is performed so that the common electrode or the pixel electrode meets the transmittance requirements. Compared to the method for manufacturing the array substrate in the prior art, the present invention reduces at least one patterning process, effectively simplifies the manufacturing procedure of the array substrate, reduces the cost for mask plate and material, reduces the equipment investment, saves the production cost, improves the productivity, and increases the competitiveness of the display device.

It should be understood that, the above embodiments are just exemplary embodiments employed to describe the principle of the present invention, and the present invention is not limited thereto. For persons skilled in the art, various variations and improvements can be made without departing from the spirit and scope of the present invention, and these variations and improvements should be considered to belong to the protection scope of the invention.

The invention claimed is:

1. An array substrate, including a base substrate, and a thin film transistor and at least one driving electrode provided on the base substrate, wherein the thin film transistor includes a gate, and a source/a drain provided in the same layer; and the gate, the source, or the drain is a film layer formed of the same material as the at least one driving electrode, and the thickness thereof is larger than that of the at least one driving electrode;

wherein the at least one driving electrode includes a first electrode and a second electrode, the first electrode and the second electrode at least partially overlap in the orthographic projection direction, and the second electrode is provided below the first electrode;

wherein one of the gate, the source and the drain which is located in the upper layer is a film layer formed of the same material as the first electrode, and the thickness thereof is larger than that of the first electrode; and/or one of the gate, the source and the drain which is located in the lower layer is a film layer formed of the same material as the second electrode, and the thickness thereof is larger than that of the second electrode;

wherein the film layer formed of the same material is a multi-layered composite film layer formed of one-dimensional metal-dielectric photonic crystals; and the metal includes silver, and the dielectric includes zinc sulfide or indium tin oxide; and wherein the at least one driving electrode is formed by thinning the multi-layered composite film layer formed of one-dimensional metal-dielectric photonic crystals so that one or more layers in the multi-layered composite film layer are removed.

2. The array substrate of claim 1, wherein the first electrode is a slit-shaped pixel electrode, the second electrode is a plate-shaped common electrode, and the pixel electrode is electrically connected to the drain; or the first electrode is a slit-shaped common electrode, the second electrode is a plate-shaped pixel electrode, and the pixel electrode is electrically connected to the drain.

3. The array substrate of claim 1, wherein the at least one driving electrode has a transmittance in a range of 30% to 90%, and has a thickness in a range of 100 Å to 1000 Å.

4. The array substrate of claim 1, wherein the at least one driving electrode includes a pixel electrode, the source or the drain is a film layer formed of the same material as the pixel electrode, and the thickness thereof is larger than that of the pixel electrode.

5. A display device, including the array substrate of claim 1.

6. A method for manufacturing an array substrate, including a step of forming a thin film transistor and at least one driving electrode on a base substrate, wherein the thin film transistor includes a gate, and a drain and a source provided in the same layer, and one of the gate, the source and the drain is a film layer formed of the same material as the at least one driving electrode, and the thickness thereof is larger than that of the at least one driving electrode;

wherein one of the gate, the source and the drain and one driving electrode of the at least one driving electrode are formed by a single patterning process as follows:

Step S1: forming a metal electrode layer;

Step S2: forming a photoresist layer on the metal electrode layer;

Step S3: performing exposure and development processes on the photoresist layer using a half tone mask plate or a gray tone mask plate so that photoresist at a region where the one of the gate, the source and the drain is to be formed is completely remained, photoresist at a region where the one driving electrode is to be formed is partially remained, and photoresist at other regions is completely removed;

Step S4: performing a first etching process on the metal electrode layer so that metal electrode material at regions other than the region where the one of the gate, the source and the drain is to be formed and the region where the one driving electrode is to be formed is removed;

Step S5: performing a thinning treatment on the photoresist layer so that photoresist at the region where the one of the gate, the source and the drain is to be formed is partially remained, and photoresist at the region where the one driving electrode is to be formed is completely removed;

Step S6: performing a second etching process on the metal electrode layer so that metal electrode material at the region where the one driving electrode is to be formed is partially removed to form a pattern including the one of the gate, the source and the drain, and the one driving electrode;

Step S7: removing the remaining photoresist in the photoresist layer;

wherein the step of forming the metal electrode layer includes forming a multi-layered composite film layer formed of one-dimensional metal-dielectric photonic crystals, wherein the metal includes silver, and the dielectric includes zinc sulfide or indium tin oxide; and wherein the at least one driving electrode is formed by thinning the multi-layered composite film layer formed of one-dimensional metal-dielectric photonic crystals so that one or more layers in the multi-layered composite film layer are removed.

7. The method of claim 6, wherein the step of forming a pattern including the one of the gate, the source and the drain, and the one driving electrode includes forming the one driving electrode which has a thickness in a range of 100 Å to 1000 Å, and has a transmittance in a range of 30% to 90%.

8. The method of claim 6, wherein the step of performing a thinning treatment on the photoresist layer includes performing a thinning treatment on the photoresist layer by an ashing process.

9. The method of claim 6, wherein the at least one driving electrode includes a first electrode and a second electrode, the first electrode and the second electrode at least partially overlap in the orthographic projection direction, and the second electrode is provided below the first electrode, wherein
- one of the gate, the source and the drain and one driving electrode of the at least one driving electrode are formed by a single patterning process as follows:
- one of the gate, the source and the drain which is located in the upper layer, and the first electrode are simultaneously formed by a single patterning process; and/or
- one of the gate, the source and the drain which is located in the lower layer, and the second electrode are simultaneously formed by a single patterning process.

10. The method of claim 9, wherein the first electrode is a slit-shaped pixel electrode, the second electrode is a plate-shaped common electrode, and the pixel electrode is electrically connected to the drain; or
- the first electrode is a slit-shaped common electrode, the second electrode is a plate-shaped pixel electrode, and the pixel electrode is electrically connected to the drain.

11. The method of claim 6, wherein the driving electrode includes a pixel electrode,
- one of the gate, the source and the drain and one driving electrode of the at least one driving electrode are formed by a single patterning process as follows:
- the source, and the drain and the pixel electrode are simultaneously formed by a single patterning process so that the pixel electrode is electrically connected to the drain.

\* \* \* \* \*